(12) United States Patent
Singh

(10) Patent No.: US 7,232,704 B2
(45) Date of Patent: Jun. 19, 2007

(54) SEMICONDUCTOR DEVICE ASSEMBLY METHOD AND SEMICONDUCTOR DEVICE ASSEMBLY APPARATUS

(75) Inventor: Brahm Pal Singh, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 268 days.

(21) Appl. No.: 11/080,642

(22) Filed: Mar. 16, 2005

(65) Prior Publication Data
US 2005/0214972 A1 Sep. 29, 2005

(30) Foreign Application Priority Data
Mar. 24, 2004 (JP) ............................. 2004-086526

(51) Int. Cl.
*H01L 21/44* (2006.01)
(52) U.S. Cl. ...................... 438/106; 438/107; 438/455; 257/E21.499
(58) Field of Classification Search ................ 438/120
See application file for complete search history.

(56) References Cited

U.S. PATENT DOCUMENTS 5,904,545 A 5/1999 Smith et al.
7,172,789 B2 * 2/2007 Smith et al. ................ 427/162
2004/0063233 A1 * 4/2004 Onozawa ..................... 438/22

* cited by examiner

*Primary Examiner*—Michael Lebentritt
*Assistant Examiner*—Cheung Lee
(74) *Attorney, Agent, or Firm*—McDermott Will & Emery LLP

(57) ABSTRACT

Prepared first are a mounting substrate having, on its principal surface, a plurality of recesses which correspond in plan configuration to a plurality of functional chips, and a flat plate disposed on the mounting substrate and having a plurality of confinement regions formed of openings, each of which exposes one of the recesses and a peripheral portion of the recess and is designed to confine one of the functional chips. Next, the functional chips are put into the respective confinement regions on the mounting substrate. The mounting substrate having the functional chips thereon is then immersed in a fluid together with the flat plate. Subsequently, the flat plate immersed in the fluid is displaced (vibrated) with the mounting substrate fixed, thereby fitting the functional chips into the recesses in the mounting substrate.

28 Claims, 8 Drawing Sheets

SEMICONDUCTOR DEVICE ASSEMBLY METHOD AND SEMICONDUCTOR DEVICE ASSEMBLY APPARATUS

CROSS-REFERENCE TO RELATED APPLICATION

The disclosure of Japanese Patent Application No. 2004-86526 filed on Mar. 24, 2004 including specification, drawings and claims is incorporated herein by reference in its entirety.

BACKGROUND OF THE INVENTION

The present invention relates to a semiconductor-device assembly method and a semiconductor-device assembly apparatus, in which an assembly method for simultaneously assembling a plurality of micro functional chips, i.e., semiconductor devices or the like, onto a mounting substrate is used.

Techniques for assembling micro functional chips, such as electronic components, onto a mounting substrate, such as a wafer or substrate, simultaneously in a single operation to fabricate semiconductor devices have been attracting considerable attention recently. At present, assembly process for mass production is normally being performed by pick and place technique in which assembly robots pick functional chips and place them in predetermined locations. However, since the cost and speed of the assembly robots are limited, it is necessary to find an alternative means which enables the assembly of a large number of functional chips with higher speed and lower cost.

As one of the technologies considered for this purpose, fluidic self assembly (FSA) has been proposed recently. The FSA technology is a technique for assembling in a fluid a plurality of functional chips onto a mounting substrate in a self-aligned manner.

Hereinafter, a conventional FSA process will be described with reference to FIGS. 7 and 8.

FIG. 7 schematically illustrates a semiconductor-device assembly apparatus 300A in which a FSA process according to a first conventional example is used. As shown in FIG. 7, a mounting substrate 410 is a wafer or a printed circuit board, has on its surface a plurality of recesses 410a for specifying assembling positions, and is held in a fluid with its surface inclined with respect to the surface of the fluid. Then, a fluid 311 in the form of slurry, in which a large number of functional chips 400 has been spread, is poured over the surface of the mounting substrate 410 through a pipette 310. The functional chips 400 are typically in the shape of a square, disc, or sphere. The numerous functional chips 400 contained in the fluid 311 poured over the surface of the mounting substrate 410 fit, by chance and naturally, into the empty recesses 410a having the matching shape, while sliding on the surface of the mounting substrate 410.

FIG. 8 schematically illustrates a semiconductor-device assembly apparatus 300B with a bubble pump according to a second conventional example. As shown in FIG. 8, the bubble-pump-equipped semiconductor-device assembly apparatus 300B is composed of a container 312, in which a fluid 311 and a mounting substrate 410 are placed, and a bubble pump system 313 for circulating functional chips 400.

The bubble pump system 313 carries the functional chips 400 that have not yet been disposed into recesses in the mounting substrate 410, to a position higher than the mounting substrate 410 by the buoyancy of bubbles 311a. The carried functional chips 400 are then poured over the surface of the mounting substrate 410 again. The bubbles 311a are created by a bubble-velocity controller 313a provided in the lower portion of the bubble pump system 313 from nitrogen gas 314 supplied to the bubble pump system 313.

However, in the conventional semiconductor-device assembly apparatus, the probability that the functional chips fit into the recesses in the mounting substrate depends upon the density of the recesses. Therefore, in order to achieve a high assembling efficiency, an enormous number of functional chips have to be prepared as compared with the density of the recesses. On the other hand, in the bubble pump shown in FIG. 8, the functional chips that have not been placed into the recesses can be reused, which allows the number of necessary functional chips to be reduced. Nevertheless, the assembling efficiency achievable by these types of semiconductor-device assembly apparatuses is limited and depends upon the shape of the semiconductor devices, for example. For instance, it has been reported that when disc-like functional chips having a given thickness and a given size were replaced with square-shaped functional chips, the assembling efficiency dropped from over 90% to less than 40%. This indicates that functional chips having a smaller number of symmetry axes have lower assembling efficiency. Therefore, it can be concluded that if square-shaped functional chips are replaced with rectangular functional chips, the assembling efficiency may be reduced to about half, as the square has four symmetric edges, while the rectangle has only two symmetric edges. If these rectangular functional chips are further made directional as required for semiconductor lasers, the assembling efficiency may be further reduced to half, and the assembling efficiency finally obtained may not exceed 10%. Since the assembling efficiency of functional chips is usually required to exceed 99% (at least 90%), there is a demand for a method which enables functional chips to be assembled with high assembling efficiency and accuracy, irrespective of the size and shape of the functional chips.

SUMMARY OF THE INVENTION

An object of the present invention is therefore to overcome the above problems and enable highly efficient, speedy self-assembly, in a fluid, of a plurality of functional chips of any size and shape into recesses formed in a mounting substrate and having the same size as the functional chips.

In order to achieve the above object, in the present invention, a fluid in which a plurality of functional chips have been spread is not randomly poured over a mounting substrate having a number of recesses formed therein, but functional chips are each confined in one of regions which are bigger than recesses in a mounting substrate but smaller than a particular limit specified by the size of the functional chips. Then, with the desired number of functional chips, that is, the number of functional chips to be assembled onto the mounting substrate, nearly 100% assembly of the functional chips is possible irrespective of the size and shape of the functional chips.

Specifically, a first inventive semiconductor-device assembly method includes the steps of: (a) preparing a mounting substrate having, on its principal surface, a plurality of recesses which correspond in plan configuration to a plurality of functional chips; and a flat plate disposed on the mounting substrate and having a plurality of confinement regions formed of openings, each of which exposes one of the recesses and a peripheral portion of the recess and is designed to confine one of the functional chips; (b) putting the functional chips into the respective confinement regions on the mounting substrate; (c) immersing in a fluid the mounting substrate having the functional chips thereon, together with the flat plate; and (d) displacing the flat plate immersed in the fluid with the mounting substrate fixed, thereby fitting the functional chips into the recesses in the mounting substrate.

According to the first inventive method, disposed on a mounting substrate having a plurality of recesses which correspond in plan configuration to functional chips is a flat plate having a plurality of confinement regions formed of openings, each of which exposes one of the recesses and a peripheral portion of the recess and is designed to confine one of the functional chips. The functional chips are put into the respective confinement regions, and then the flat plate immersed in a fluid is displaced, thereby fitting the functional chips into the recesses in the mounting substrate. By this method, it is possible to assemble the plurality of functional chips of any size and shape into their corresponding recesses formed in the mounting substrate, with high efficiency, accuracy, reliability and speed using fluidic and gravitational forces.

A second inventive semiconductor-device assembly method includes the steps of: (a) preparing a mounting substrate having, on its principal surface, a plurality of recesses which correspond in plan configuration to a plurality of functional chips each including a semiconductor device; and a flat plate disposed on the mounting substrate and having a plurality of confinement regions formed of openings, each of which exposes one of the recesses and a peripheral portion of the recess and is designed to confine one of the functional chips; (b) putting the functional chips into the respective confinement regions on the mounting substrate; (c) immersing in a fluid the mounting substrate having the functional chips thereon, together with the flat plate; and (d) displacing the mounting substrate immersed in the fluid with the flat plate fixed, thereby fitting the functional chips into the recesses in the mounting substrate.

According to the second inventive method, disposed on a mounting substrate having a plurality of recesses which correspond in plan configuration to functional chips is a flat plate having a plurality of confinement regions formed of openings, each of which exposes one of the recesses and a peripheral portion of the recess and is designed to confine one of the functional chips. The functional chips are put into the respective confinement regions, and then the mounting substrate immersed in a fluid is displaced, thereby fitting the functional chips into the recesses in the mounting substrate. By this method, it is possible to assemble the plurality of functional chips of any size and shape into their corresponding recesses formed in the mounting substrate, with high efficiency, accuracy, reliability and speed using fluidic and gravitational forces.

A third inventive semiconductor-device assembly method includes the steps of: (a) preparing a mounting substrate having a plurality of recesses and sets of small slots; small pins formed movable through the small slots in the mounting substrate; and a flat plate disposed on the mounting substrate and having a plurality of confinement regions, wherein the recesses are formed on the principal surface of the mounting substrate and correspond in plan configuration to a plurality of functional chips each including a semiconductor device, each of the small slot sets is formed near one of the recesses, the small slots are smaller in plan dimensions than the recesses, and the confinement regions are formed of openings, each of which exposes one of the recesses and one of the small slot sets and is designed to confine one of the functional chips; (b) putting the functional chips into the respective confinement regions on the mounting substrate; (c) immersing in a fluid the mounting substrate having the functional chips thereon, together with the flat plate and the small pins; and (d) displacing the small pins immersed in the fluid with the mounting substrate and the flat plate fixed, thereby fitting the functional chips into the recesses in the mounting substrate.

According to the third inventive method, a flat plate is disposed on a mounting substrate that has a plurality of recesses corresponding in plan configuration to functional chips, and sets of small slots each formed near one of the recesses, with the small slots being smaller in plan dimensions than the recesses. The flat plate has a plurality of confinement regions formed of openings, each of which exposes one of the recesses and one of the small slot sets and is designed to confine one of the functional chips. The functional chips are put into the respective confinement regions, and then the small pins immersed in a fluid are displaced, thereby fitting the functional chips into the recesses in the mounting substrate. By this method, it is possible to assemble the plurality of functional chips of any size and shape into their corresponding recesses formed in the mounting substrate, with high efficiency, accuracy, reliability and speed using fluidic and gravitational forces.

In the first inventive method, in the step (d), the displacement of the flat plate is preferably limited within a range in which unassembled functional chips that have not yet been fitted into the recesses move to the recesses but do not come into contact with assembled functional chips that have already been fitted into the recesses.

Also, in the first inventive method, in the step (d), the displacement of the flat plate is preferably performed in a direction parallel to the surface of the substrate and perpendicular to the edges of the functional chips or the peripheries of the recesses.

In the second inventive method, in the step (d), the displacement of the mounting substrate is preferably limited within a range in which unassembled functional chips that have not yet been fitted into the recesses move to the recesses but do not come into contact with assembled functional chips that have already been fitted into the recesses.

Also, in the second inventive method, in the step (d), the displacement of the mounting substrate is preferably performed in a direction parallel to the surface of the substrate and perpendicular to the edges of the functional chips or the peripheries of the recesses.

In the third inventive method, in the step (d), the displacement of the small pins is preferably limited within a range in which unassembled functional chips that have not yet been fitted into the recesses move to the recesses but do not come into contact with assembled functional chips that have already been fitted into the recesses.

Also, in the third inventive method, the small slots in the mounting substrate are preferably formed so that in the step (d), the displacement of the small pins is performed in a direction parallel to the surface of the substrate and perpendicular to the edges of the functional chips or the peripheries of the recesses.

In the first and second inventive methods, when the functional chips have a high degree of symmetry in their plan configuration and are not directional, the confinement regions are preferably similar in plan configuration to the functional chips or the recesses.

Also, in the first and second inventive methods, when the functional chips have a low degree of symmetry in their plan configuration, the dimensions of the confinement regions are preferably set to values which prevent the functional chips from rotating 90 degrees or more in the confinement regions.

In the first through third inventive methods, in the step (c), the mounting substrate and the flat plate are preferably immersed in the fluid with the flat plate covered with a lid.

Also, the first through third inventive methods preferably further include: before the step (b), the step (e) of providing a solder material on the bottom surfaces of the recesses in the mounting substrate or on the bottom surfaces of the functional chips; and after the step (d), the step (f) of removing the fluid from the mounting substrate and then heating the mounting substrate to fix the functional chips on the mounting substrate.

In this case, it is preferable that in the step (f), the mounting substrate is heated with the functional chips pressed from above.

A fourth inventive semiconductor-device assembly method is a method for assembling onto a mounting substrate at least two types of functional chips which are different in size but similar in plan configuration and each include a semiconductor device. The inventive method includes the steps of: (a) preparing a mounting substrate having, on its principal surface, a plurality of recesses which correspond in plan configuration to the two types of functional chips; and a flat plate disposed on the mounting substrate and having a plurality of confinement regions formed of openings, which expose the recesses and peripheral portions of the recesses and are designed to confine the two types of functional chips; (b) providing a solder material on the bottom surfaces of the functional chips of one of the two types and on the bottom surfaces of some of the recesses in the mounting substrate which correspond to the functional chips of the other type; (c) putting the functional chips of the other type into some of the confinement regions on the mounting substrate which include therein the recesses corresponding to the functional chips of the other type and having the solder material thereon; (d) immersing in a fluid the mounting substrate having the functional chips of the other type thereon, together with the flat plate; (e) displacing the mounting substrate or the flat plate immersed in the fluid, thereby fitting the functional chips of the other type into the corresponding recesses in the mounting substrate; (f) removing the fluid from the mounting substrate and then heating the mounting substrate to fix the functional chips of the other type on the mounting substrate; (g) putting the functional chips of the one type having the solder material on their bottom surfaces, into some of the confinement regions on the mounting substrate which include therein the recesses corresponding to the functional chips of the one type; (h) immersing in a fluid the mounting substrate having the functional chips of the one type thereon, together with the flat plate; (i) displacing the mounting substrate or the flat plate immersed in the fluid, thereby fitting the functional chips of the one type into the corresponding recesses in the mounting substrate; and (j) removing the fluid from the mounting substrate and then heating the mounting substrate to fix the functional chips of the one type on the mounting substrate.

According to the fourth inventive method, in assembling onto a mounting substrate at least two types of functional chips which are different in size but similar in plan configuration, as shown in the step (b), a solder material is provided on the bottom surfaces of the functional chips of one of the two types and on the bottom surfaces of some of the recesses in the mounting substrate which correspond in plan configuration to the functional chips of the other type. In the subsequent step (c), the functional chips of the other type having no solder material provided thereon are put into some of the confinement regions which include therein the recesses corresponding in plan configuration to the functional chips of the other type and having the solder material thereon, and thereafter, the assembly process is performed in the same manner as in the first inventive assembly method. Then, in the step (g), the functional chips of the one type having the solder material on their bottom surfaces are put into some of the confinement regions which include therein the recesses corresponding to the functional chips of the one type. Since the recesses corresponding to the functional chips of the one type are not provided with a solder material, even if the functional chips of the other type having no solder material on their bottom surfaces fall into the recesses corresponding to the functional chips of the one type, for example, the functional chips of the other type are not fixed in the recesses corresponding to the functional chips of the one type. Accordingly, even the functional chips having the different plan shapes are selectively self-assembled into the predetermined assembly positions.

In the fourth inventive method, in the steps (f) and (j), it is preferable that the mounting substrate is heated with the functional chips pressed from above.

A first inventive semiconductor-device assembly apparatus includes: a mounting substrate having, on its principal surface, a plurality of recesses which correspond in plan configuration to a plurality of functional chips each including a semiconductor device; and a flat plate disposed on the mounting substrate and having a plurality of confinement regions formed of openings, each of which exposes one of the recesses and a peripheral portion of the recess and is designed to confine one of the functional chips, wherein the functional chips are put into the respective confinement regions on the mounting substrate; the mounting substrate having the functional chips thereon is then immersed in a fluid together with the flat plate; and the flat plate is displaced, thereby fitting the functional chips into the recesses in the mounting substrate.

A second inventive semiconductor-device assembly apparatus includes: a mounting substrate having a plurality of recesses and sets of small slots, the recesses being formed on the principal surface of the mounting substrate and corresponding in plan configuration to a plurality of functional chips each including a semiconductor device, each of the small slot sets being formed near one of the recesses, the small slots being smaller in plan dimensions than the recesses; small pins formed movable through the small slots in the mounting substrate; and a flat plate disposed on the mounting substrate and having a plurality of confinement regions formed of openings, each of which exposes one of the recesses and one of the small slot sets and is designed to confine one of the functional chips, wherein the functional chips are put into the respective confinement regions on the mounting substrate; the mounting substrate having the functional chips thereon is then immersed in a fluid together with the flat plate and the small pins; and the small pins are displaced, thereby fitting the functional chips into the recesses in the mounting substrate.

BRIEF DESCRIPTION OF THE DRAWINGS

FIG. 1A is a plan view illustrating a lattice-shaped flat plate, while FIG. 1B is a plan view illustrating a container to have a fluid, in which a mounting substrate is immersed.

FIG. 2A is an oblique view indicating a state before the completion of assembly, in which the mounting substrate and the flat plate are immersed in the fluid in the container, while FIG. 2B is a partial oblique view indicating the state.

FIG. 3A is an oblique view indicating a state after the completion of assembly, in which the mounting substrate and the flat plate are immersed in the fluid in the container, while FIG. 3B is a partial oblique view indicating the state.

FIG. 4A is a partial oblique view indicating a state before the completion of assembly in a semiconductor-device assembly apparatus according to a modified example of the first embodiment of the present invention, while

DESCRIPTION OF THE PREFERRED EMBODIMENTS

First Embodiment

A first embodiment of the present invention will be described with reference to the accompanying drawings.

Figure 1A:
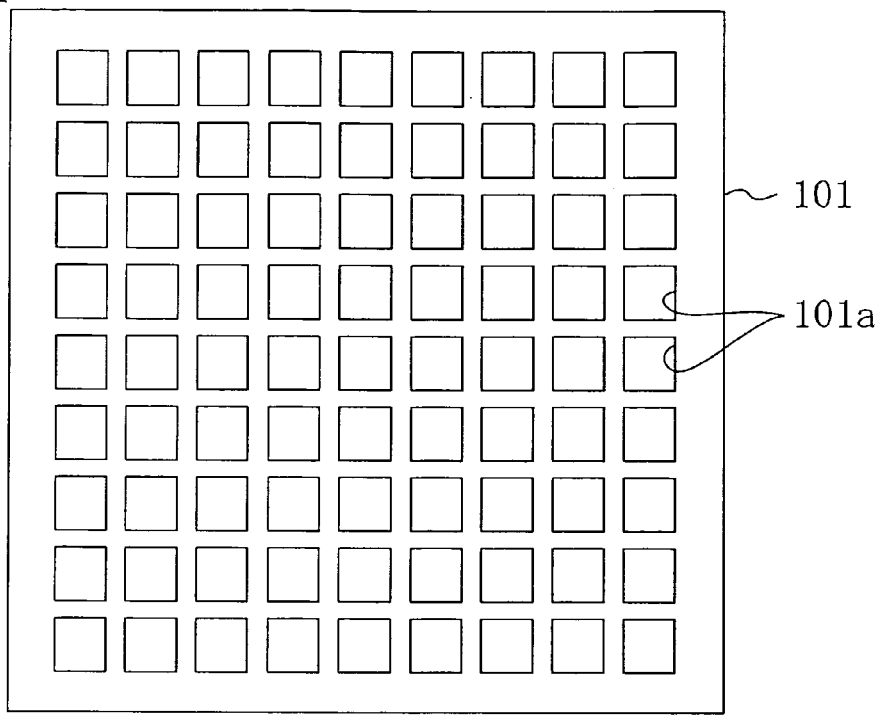
FIGS. 1A and 1B illustrate a semiconductor-device assembly apparatus according to a first embodiment of the present invention.
Figure 1B:
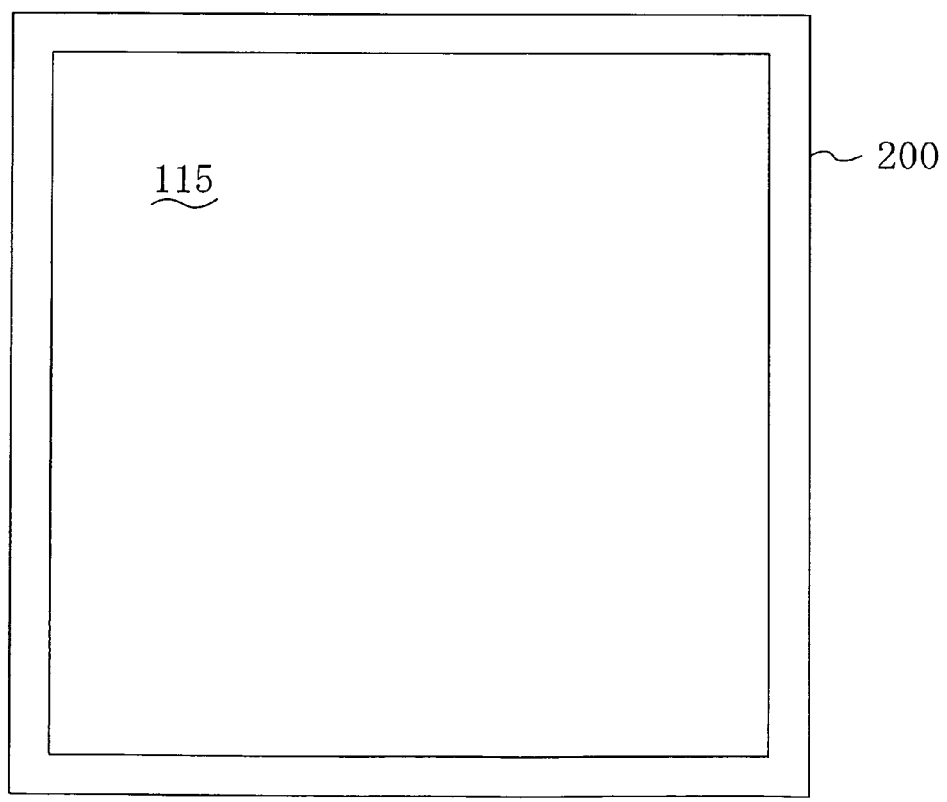

FIGS. 1A and 1B illustrate a semiconductor-device assembly apparatus according to the first embodiment of the present invention. FIG. 1A illustrates the plan configuration of a lattice-shaped flat plate, while FIG. 1B indicates the plan configuration of a container to have a fluid, in which a mounting substrate is immersed.

As shown in FIG. 1A, a flat plate 101 is made of nickel (Ni) or nickel alloy having a thickness of about 150 nm, for example, and has a plurality of openings 101a which are arranged in a matrix. FIG. 1B shows a container 200 in which a mounting substrate (not shown) with the flat plate 101 held on its principal surface is immersed in a fluid 115 together with functional chips.

Figure 2A:
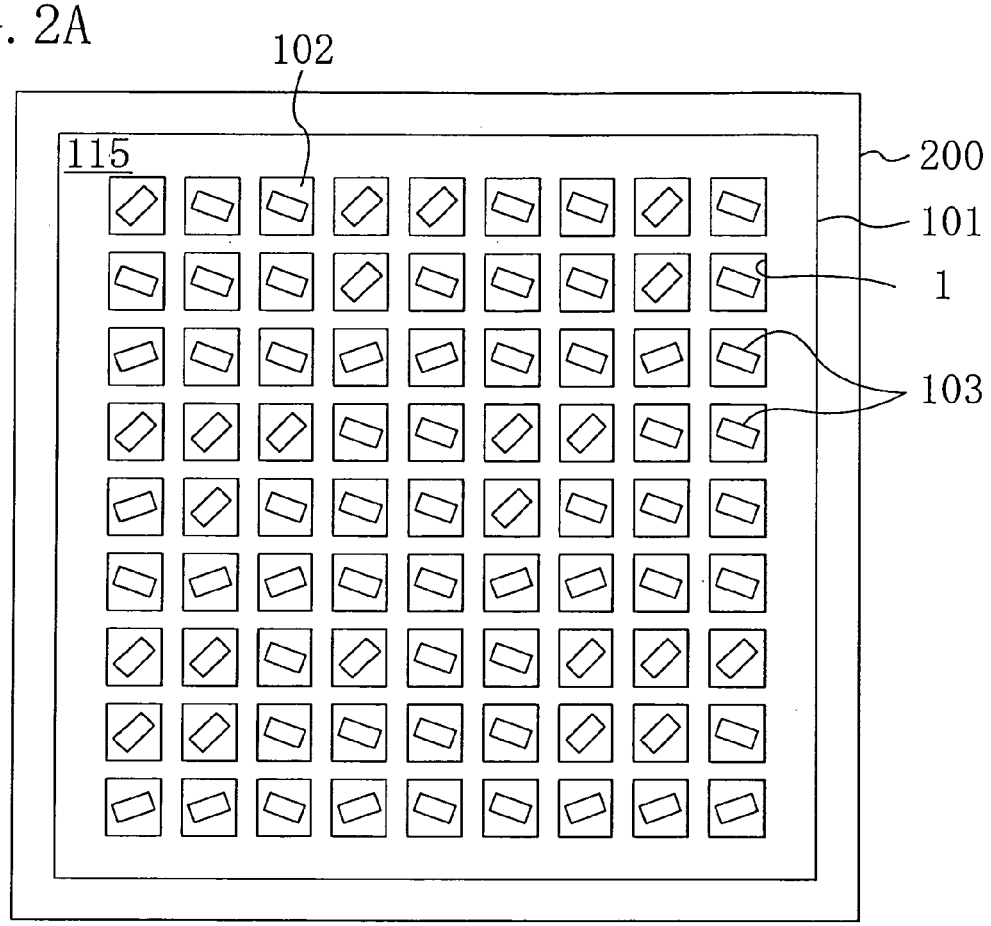
FIGS. 2A and 2B illustrate the semiconductor-device assembly apparatus according to the first embodiment of the present invention.
Figure 2B:
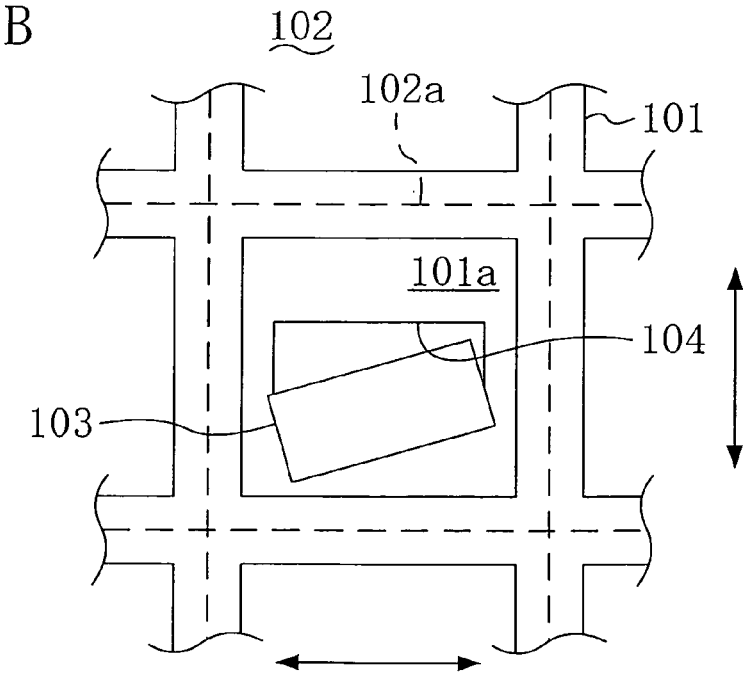

As shown in FIG. 2A and FIG. 2B, which is an enlarged view of FIG. 2A, a mounting substrate 102 is first placed in the container 200 and the flat plate 101 is then put on the mounting substrate 102. In this embodiment, the depth of the container 200 is substantially equal to the thickness of the mounting substrate 102, and the inside dimensions of the container 200 are set such as to allow the flat plate 101 to move in the horizontal direction only within a predetermined range.

The mounting substrate 102 has a plurality of recesses 104 each having a rectangular shape when viewed from above, and each opening 101a formed in the flat plate 101 surrounds a region in the mounting substrate 102 in which one of the recesses 104 and the peripheral portion thereof are included, so that at least one functional chip 103 can be confined within the opening 101a. In this embodiment, each recess 104 has the same plan shape as the bottom surface of each functional chip 103 and has a size which allows the lower portion of the functional chip 103 to be fitted in the recess 104. The flat plate 101 is disposed on the mounting substrate 102 in such a manner that the sides of the openings (hereinafter referred to as "confinement regions") 101a in the flat plate 101 are perpendicular or parallel to the sides of the recesses 104 formed in the mounting substrate 102. In FIG. 2B, regions 102a indicated on the mounting substrate 102 are, e.g., sub-mount regions, into which the mounting substrate 102 is divided after the assembly of the functional chips 103 into the recesses 104 so as to be sub mounts, i.e., pieces each including one functional chip 103. The mounting substrate 102 may be a wafer made of silicon (Si) or silicon carbide (SiC), for example, or may be a printed circuit board or the like.

Subsequently, the functional chips 103 are dropped into the confinement regions 101a in the flat plate 101 for each row or column, for example, with the orientation of the functional chips 103 being aligned, if necessary. In this embodiment, the thickness of the functional chips 103 is about 135 μm. In order to prevent the functional chips 103 from lying sideways and to avoid the orientation of the functional chips 103 from being reversed, it is preferable to drop the functional chips 103 from a height not more than half the length of the chips. After the functional chips 103 have fallen into all of the rows or columns of the confinement regions 101a, the fluid 115 is poured into the container 200.

Next, the flat plate 101 having the functional chips 103 in its confinement regions 101a, or the mounting substrate 102 is displaced by vibration in a direction perpendicular or parallel with respect to the edges of the recesses 104. This displacement causes the fluid 115 to flow, which allows the unassembled functional chips 103, which have been confined in the confinement regions 101a but not yet been assembled into the recesses 104, to simultaneously self-assemble into the recesses 104. The displacement of the flat plate 101 or the mounting substrate 102 in the fluid enables the highly accurate self-assembly with least possible effect on the device structures of the functional chips 103. However, those functional chips 103 which have already been assembled into the recesses 104 are not disturbed by the movement (displacement) of the flat plate 101 and mounting substrate 102.

Figure 3A:
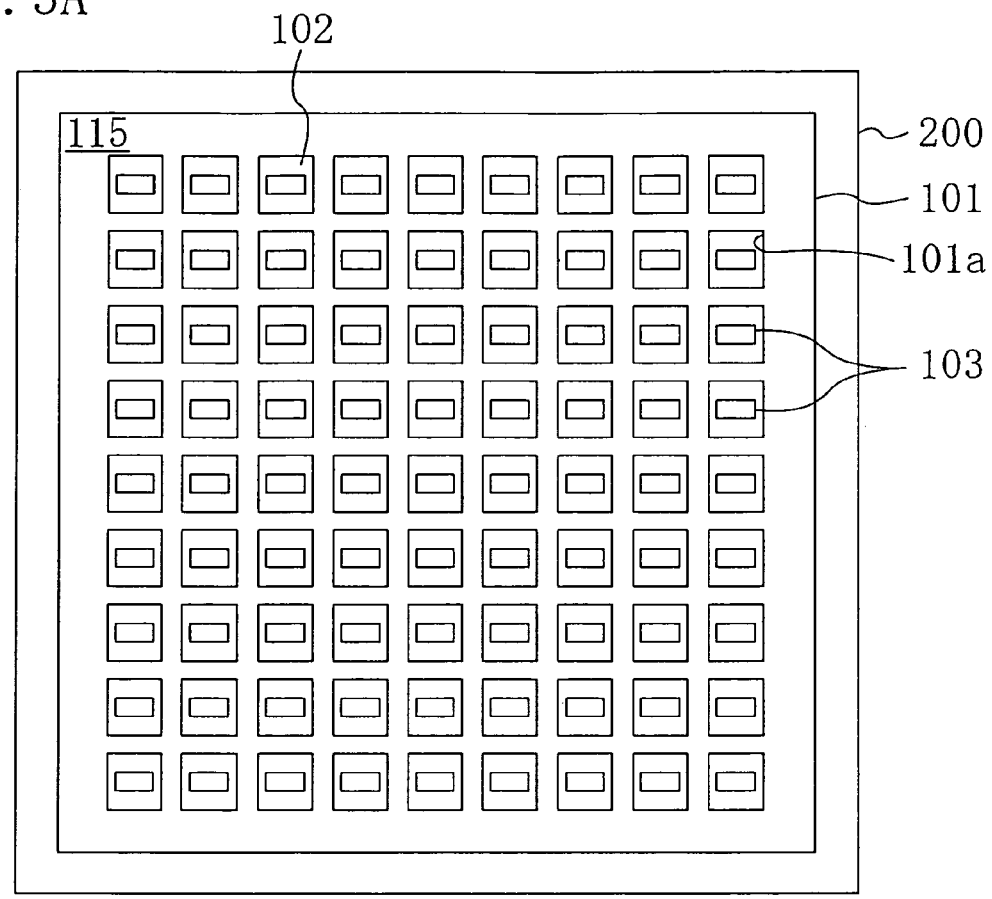
FIGS. 3A and 3B illustrate the semiconductor-device assembly apparatus according to the first embodiment of the present invention.
Figure 3B:
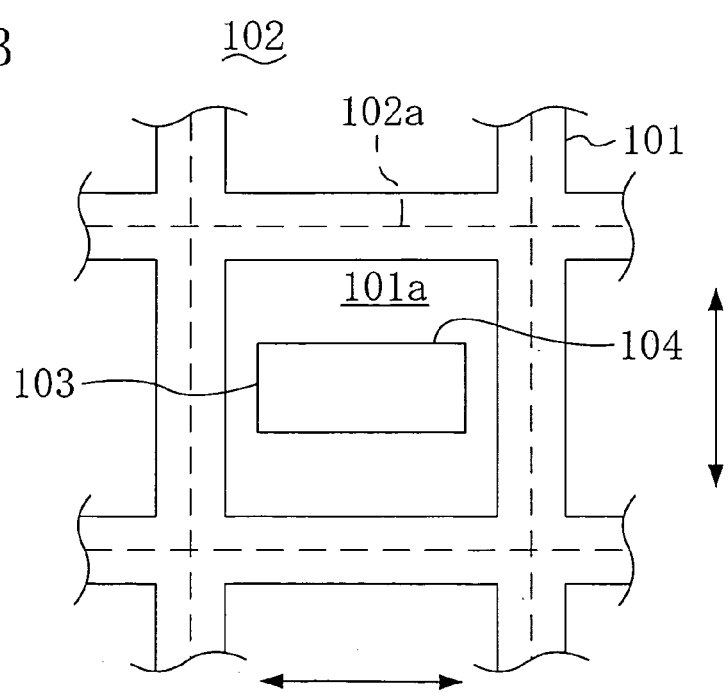

Vibration is applied several times until all of the functional chips 103 fit into the recesses 104, thereby obtaining the state shown in FIG. 3A and FIG. 3B, i.e., a magnified view of FIG. 3A. Although the flat plate 101 is held on the mounting substrate 102 in this embodiment, the present invention is not limited to this. Alternatively, vibration may be applied to the flat plate 101 with the mounting substrate 102 fixed, or vibration may be applied to the mounting substrate 102 with the flat plate 101 fixed. Also, a glass or plastic transparent plate having a plurality of small holes may be provided on the flat plate 101 in order to prevent the functional chips 103 from jumping out of the confinement regions 101a or overturning in the confinement regions 101a when the vibration is applied to the flat plate 101 or the like.

In a case where a transparent plate is used, the flat plate 101 should have a larger thickness than the functional chips 103.

In the case of semiconductor lasers, for example, in which orientation is important, the confinement regions 101a are formed to have an area and a shape which prevent the functional chips 103 from rotating 90 degrees or more within the confinement regions 101a. Also, in cases where the functional chips 103 are made directional, the functional chips 103 are confined in the confinement regions 101a in a predetermined direction. The orientation of the semiconductor lasers is ensured by drawing a graphic pattern, such as a circular pattern, on the end portions of the respective bottom surfaces of the semiconductor lasers, for example. For instance, all of the functional chips 103 are passed through a restricted region, which is a passive guide (passive track) of a parts feeder or the like, and based on their directional graphic pattern, if functional chips 103 which have passed in the reverse direction are found, those functional chips 103 are removed.

On the other hand, if the functional chips 103 are not rectangular in top plan view as is a semiconductor laser, but have a highly symmetrical shape such as a square, circle, or the like, the confinement regions 101a are not limited in area. The plan shape of the functional chips only needs to be, in general, identical to that of the recesses. Thus, the movement (displacement) of the highly symmetrical functional chips toward the recesses having the same size as those functional chips is performed by the movement (displacement) of the flat plate 101 and the mounting substrate 102.

Next, the mounting substrate 102 on which the functional chips 103 have been disposed is taken out from the container 200, with the functional chips 103 or the recesses 104 in the mounting substrate 102 having been beforehand provided with a solder material on their bottom surfaces by a plating process or the like. Thereafter, the mounting substrate 102 is subjected to a heated treatment to fix the functional chips 103 on the mounting substrate 102 with the solder material. Thereafter, the mounting substrate 102 is cut into the sub mount formation regions 102a and certain wiring is established, thereby obtaining semiconductor devices.

Modified Example of the First Embodiment

Figure 4A:
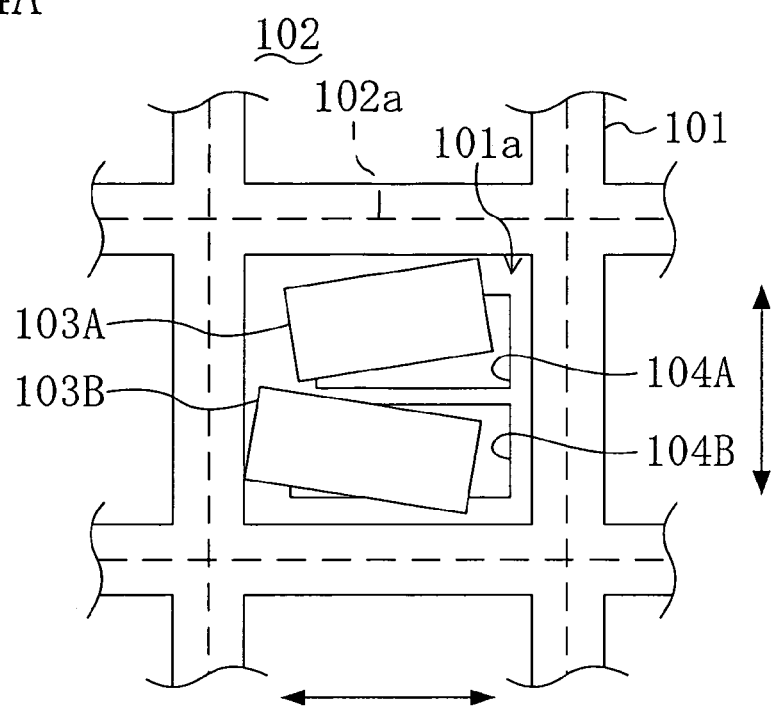
Figure 4B:
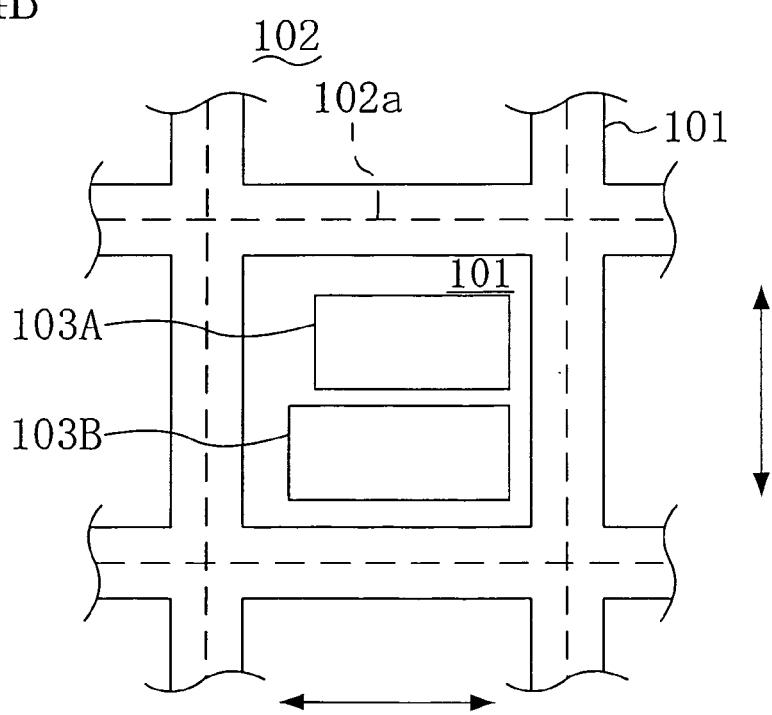
FIG. 4B is a partial oblique view indicating a state after the completion of assembly.

FIGS. 4A and 4B indicate a modified example of the first embodiment of the present invention. As shown in FIG. 4A, two recesses 104A and 104B are formed in a sub mount formation region 102a in a mounting substrate 102. The first recess 104A corresponds to a first functional chip 103A, while the second recess 104B corresponds to a second functional chip 103B which is larger in plan configuration than the first functional chip 103A. In this modified example, a flat plate 101 is disposed on the mounting substrate 102 so that each confinement region includes a pair of recesses 104A and 104B.

Next, as shown in FIG. 4B, the flat plate 101 or the mounting substrate 102 is vibrated in the parallel or perpendicular direction with respect to the long or short sides of the functional chips 103A and 103B, whereby the functional chips 103A and 103B fit into the corresponding recesses 104A and 104B.

Examples of devices in which two types of functional chips are assembled onto a sub mount formation region 102a in this way include a hybrid two-wavelength laser which is incorporated into an optical pickup compatible with both compact discs (CDs) and digital versatile discs (DVDs), for example.

In this modified example, the following method may be taken to fix the pair of functional chips 103A and 103B having the different plan shapes in the confinement region 101a with a solder material or the like. First, of the pairs of recesses 104A and 104B formed in the mounting substrate 102, only the first recesses 104A having a smaller area are plated on their bottom surfaces with a solder material. On the other hand, of the pairs of functional chips 103A and 103B, only the second functional chips 103B which are larger in bottom-surface area are plated on their bottom (lower) surfaces with the solder material. Next, the first functional chips 103A are confined in the confinement regions 101a, and vibration is then given to fit the first functional chips 103A into the respective first recesses 104A. Thereafter, a heat treatment is performed to fix the first functional chips 103A in the first recesses 104A with the solder material plated on the bottom surfaces of the first recesses 104A. Since the bottom surfaces of the first functional chips 103A and the bottom surfaces of the second recesses 104B are not plated with a solder material, even if the first functional chips 103A fall into the second recesses 104B, the first functional chips 103A are not fixed in the second recesses 104B. Subsequently, the second functional chips 103B, whose respective bottom (lower) surfaces have been plated with the solder material, are confined in the confinement regions 101a, and vibration is then given to fit the second functional chips 103B in the respective second recesses 104B. Thereafter, a heat treatment is performed to fix the second functional chips 103B in the second recesses 104B with the solder material plated on the bottom surfaces of the second functional chips 103B.

In the heat treatment processes for melting the solder material, if the upper surfaces of the first functional chips 103A and second functional chips 103B are lightly pressed, the first and second functional chips 103A and 103B are fixed onto the mounting substrate 102 more reliably.

Second Embodiment

Hereinafter, a second embodiment of the present invention will be described with reference to the accompanying figures.

Figure 5:
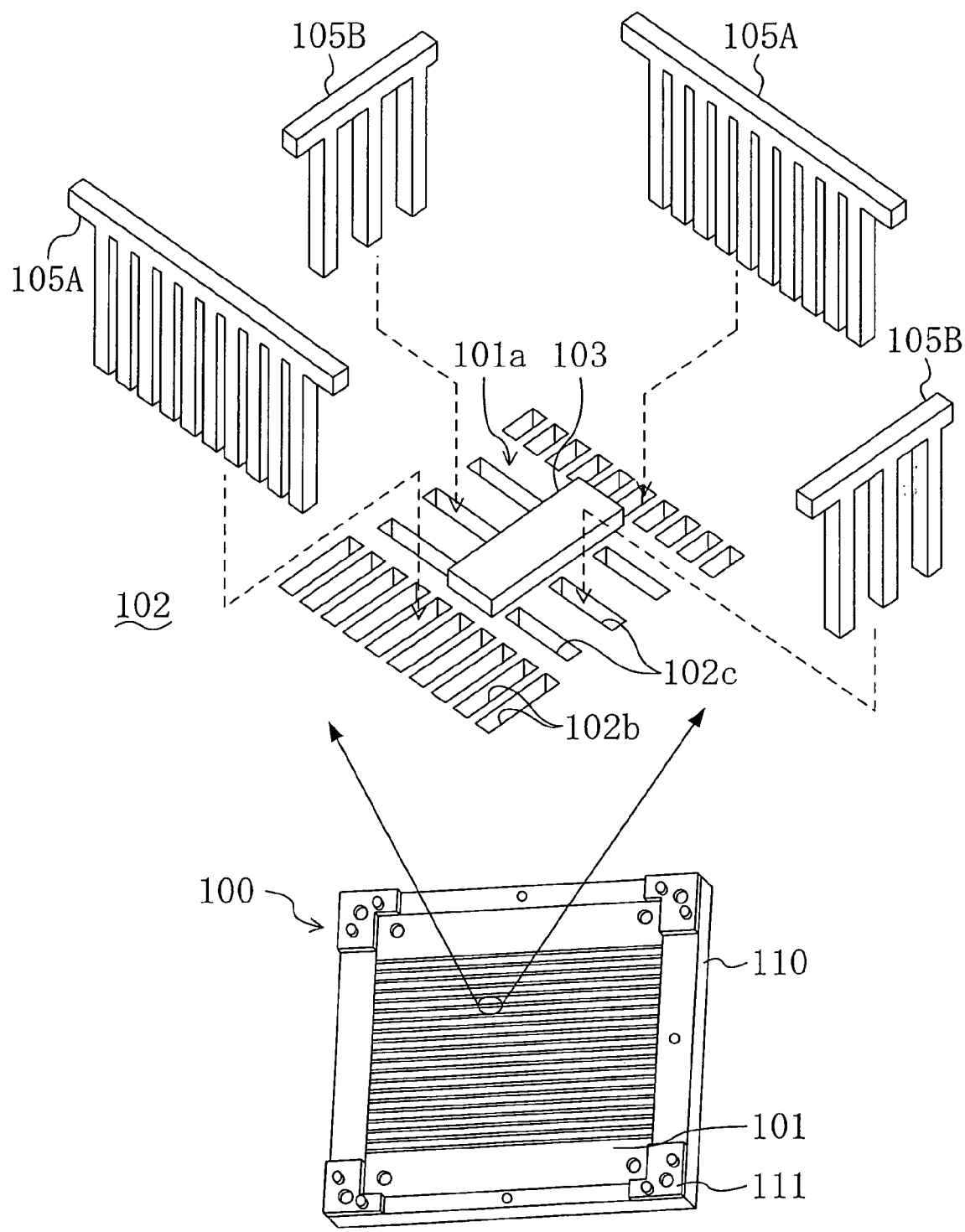
FIG. 5 is an oblique view illustrating a semiconductor-device assembly apparatus and its enlarged partial structure according to a second embodiment of the present invention.

FIG. 5 illustrates a semiconductor-device assembly apparatus and its enlarged partial structure according to the second embodiment of the present invention.

As shown in FIG. 5, a fabrication apparatus 100 is composed of a mount 110 for holding a mounting substrate 102 and a flat plate 101 disposed on the mounting substrate 102, and flat-plate stoppers 111 for holding the flat plate 101 at the four corners of the mount 110. The mount 110 is square or rectangular when viewed from above. The mounting substrate 102 is made of silicon (Si) or silicon carbide (SiC).

As shown in the enlarged view of FIG. 5, the feature of the second embodiment is that in each confinement region 101a in the mounting substrate 102 surrounded by each opening in the flat plate 101, sets of first through slots 102b and sets of second through slots 102c, which are rectangular in top plan view and vertically pass through the mounting substrate 102, are formed so as to surround a recess 104 which is also rectangular in plan view. The first through slots 102b are located lateral to the short sides of the recess 104 to sandwich them, while being arranged spaced apart from each other in the direction parallel to the short sides of the recess 104, with the long sides of each slot extending in the direction perpendicular to the short sides of the recess 104. The second through slots 102c are located lateral to the long sides of the recess 104 to sandwich them, while being arranged spaced apart from each other with the long sides of each slot extending in the direction perpendicular to the long sides of the recess 104.

A first micro pin tool 105A having a comb-like plan shape and made of silicon, for example, is disposed in each set of first through slots 102*b* in such a manner that the teeth thereof movably pass through the first through slots 102*b* from above or below vertically with respect to the substrate surface. Similarly, a second micro pin tool 105B having a comb-like plan shape is disposed in each set of second through slots 102*c* in such a manner that the teeth thereof movably pass through the second through slots 102*c* from above or below vertically with respect to the substrate surface.

In a case where the first and second micro pin tools 105A and 105B pass through the through slots 102*b* and 102*c* from above, the functional chips 103 are first placed in the confinement regions 101*a* and then the micro pin tools 105A and 105B are disposed. On the other hand, in a case where the first and second micro pin tools 105A and 105B pass through the through slots 102*b* and 102*c* from below, the micro pin tools 105A and 105B are disposed before the functional chips 103 are placed in the confinement regions 101*a*.

As described above, in the second embodiment, not only the functional chips 103 to be disposed (assembled) into the recesses 104 in the mounting substrate 102 are confined in the confinement regions 101*a* defined by the openings in the flat plate 101, but also the positions of the functional chips 103 are restricted by the movable micro pin tools 105A and 105B provided around the respective recesses 104 in the confinement regions 101*a*.

Therefore, when the fabrication apparatus 100 of the second embodiment is immersed in a fluid and vibration is applied, the fluid passing through the through slots 102*b* and 102*c* causes the teeth of the micro pin tools 105A and 105B to be displaced in parallel with the substrate surface. As a result of the displacement of the micro pin tools 105A and 105B, the unassembled functional chip 103 confined within each confinement region 101*a* is rapidly brought close to the predetermined recess 104.

The micro pin tools 105A and 105B of silicon may be formed as follows. The principal surface of a silicon wafer is patterned into a comb-like plan shape by lithography and etching processes. Then, the silicon wafer is cut into necessary thicknesses, thereby obtaining the silicon micro pin tools 105A and 105B. The material for the micro pin tools 105A and 105B is not limited to silicon, but may be any conductor, semiconductor, or insulator, so long as the material employed is nonrusting.

Third Embodiment

Hereinafter, a third embodiment of the present invention will be described with reference to the accompanying figures.

Figure 6:
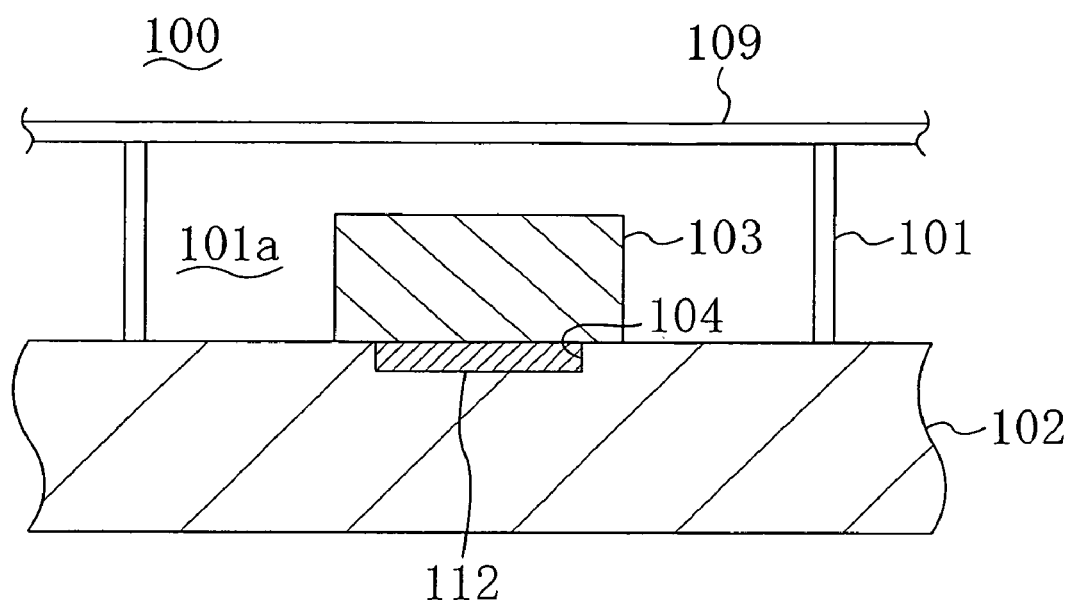
FIG. 6 is a partial cross-sectional view indicating a state after the completion of assembly in a semiconductor-device assembly apparatus according to a third embodiment of the present invention.
Figure 7:
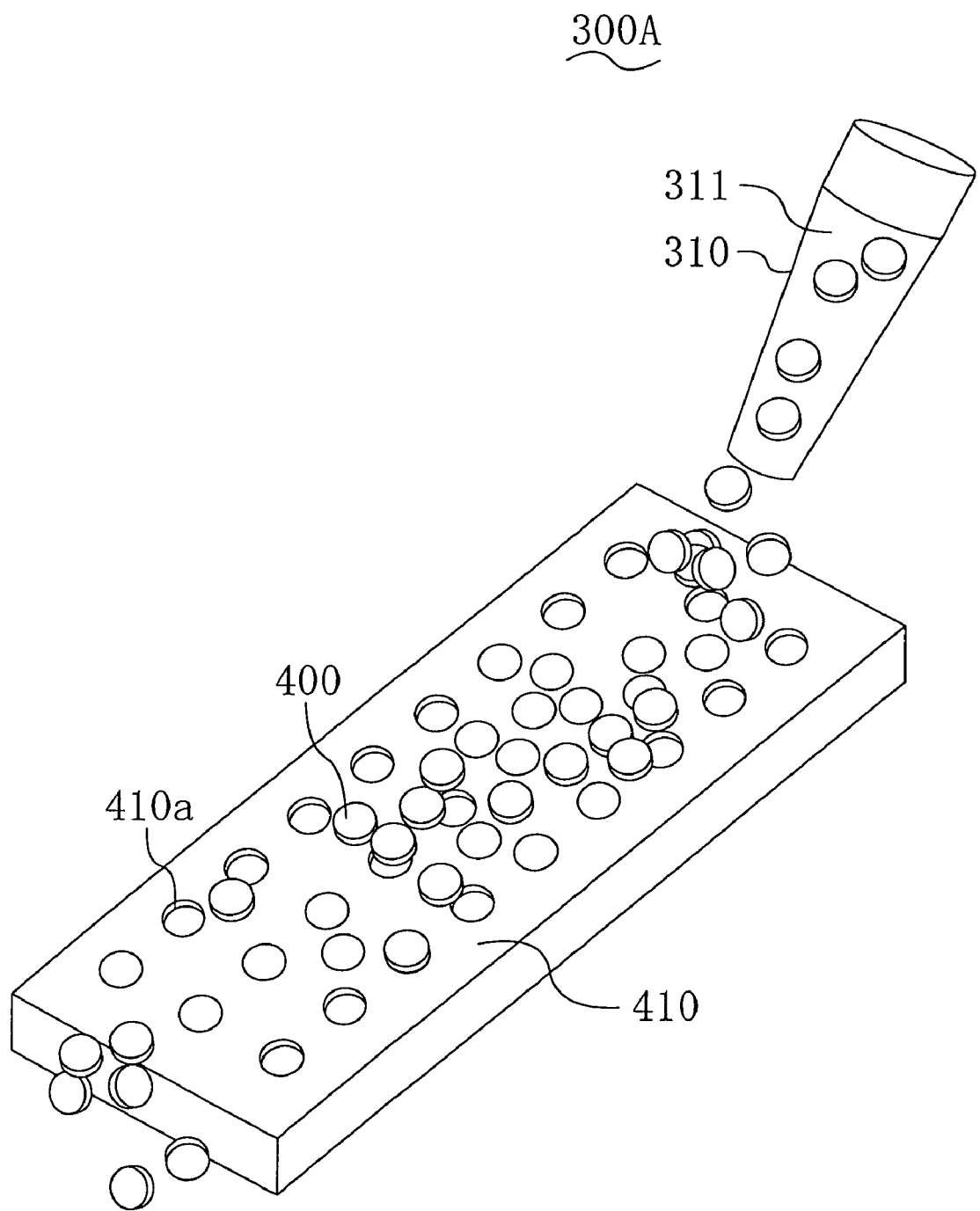
FIG. 7 is an oblique view schematically illustrating a semiconductor-device assembly apparatus according to a first conventional example.
Figure 8:
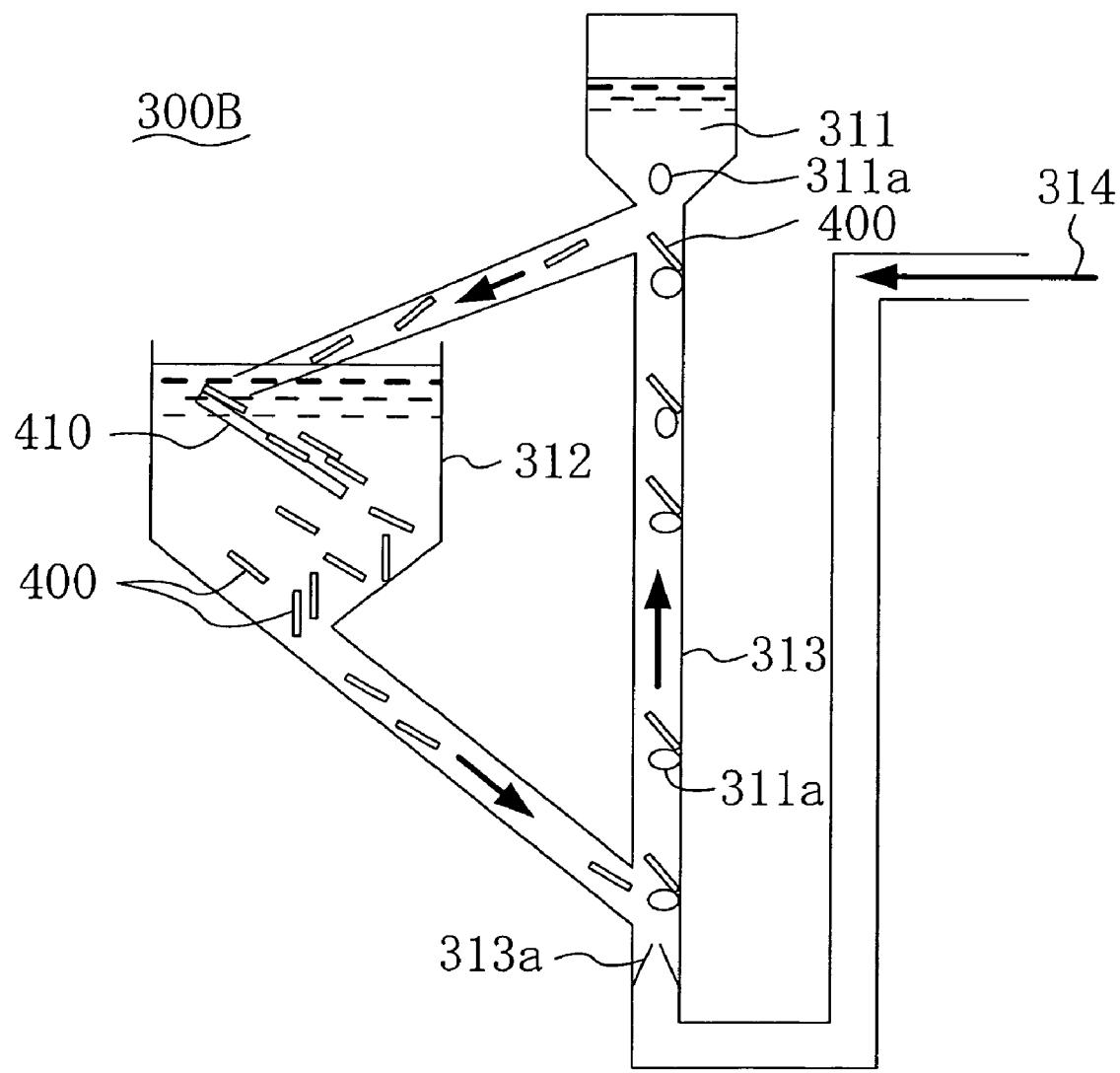
FIG. 8 is a view schematically illustrating the structure of a semiconductor-device assembly apparatus with a bubble pump according to a second conventional example.

FIG. 6 is a cross-sectional view illustrating a partial configuration of a semiconductor-device assembly apparatus according to the third embodiment of the present invention.

With reference to FIG. 6, a method for assembling functional chips 103 onto a mounting substrate 102 by using a transparent plate 109 will be described. In a fabrication apparatus (semiconductor-device assembly apparatus) 100 according to the third embodiment, a flat plate 101 is made higher, but only to the extent that the functional chips 103 each having an electrode 112 are not turned upside down, and in addition, a transparent plate 109 made of, e.g., transparent glass is provided to cover the flat plate 101. This prevents the functional chips 103 confined in confinement regions 101*a* from turning upside down within the confinement regions 101*a* or from jumping off from the confinement regions 101*a* due to vibration (displacement) applied to the fluid or the mounting substrate 102 in the assembly process.

Hereinafter, a semiconductor-device assembly method using the fabrication apparatus of the third embodiment thus configured will be described.

(1) Prepared first are a mounting substrate 102 having, on its principal surface, a plurality of recesses 104 formed in a matrix, and a flat plate 101 having a plurality of openings formed in positions corresponding to the recesses in the mounting substrate 102. The flat plate 101 is then placed on the principal surface of the mounting substrate 102 in such a manner that the recesses 104 are exposed. Thereafter, functional chips 103 are put into confinement regions 101*a* formed of the openings in the flat plate 101 which surround the respective recesses 104. On the bottom of each functional chip 103, the electrode 112 that fits in the recess 104 is formed.

(2) The flat plate 101 having the functional chips 103 confined in the respective confinement regions 101*a* is covered with a transparent plate 109.

(3) The fabrication apparatus 100 is placed in a container 200 shown in FIG. 1B, after which a fluid 115 is slowly poured on the fabrication apparatus 100 until the fabrication apparatus 100 is entirely immersed in the fluid 115. In this process, methyl alcohol ($CH_3OH$) or water ($H_2O$) may be used as the fluid 115.

(4) The transparent plate 109 is opened and then placed back after removing air bubbles accumulated in the confinement regions 101*a* between the transparent plate 109 and the mounting substrate 102. As the transparent plate 109, a plastic plate with holes, which are smaller than the functional chips 103 and located corresponding to the functional chips 103, may be used. Then, air accumulated under the bottom of the plastic plate can escape, thereby permitting the fluid 115 to be filled in the regions in the fabrication apparatus 100 in which the functional chips 103 are held.

(5) Vibration is given to the fluid 115 or the mounting substrate 102 until the functional chips 103 confined in the confinement regions 101*a* are brought near the recesses 104 in the mounting substrate 102, whereby the functional chips 103 self-assemble into the respective recesses 104. In this process, it is possible to change the orientation of the functional chips 103 with the help of the flat plate 101 or the mounting substrate 102 in restricted directions defined by the mount 110 or the flat-plate stoppers 111 shown in FIG. 5, for example. If through slots 102*b* and 102*c* and micro pin tools 105A and 105B passing through the through slots 102*b* and 102*c* are provided around each recess 104 in the mounting substrate 102 as in the second embodiment, the functional chips 103 move to the assembly positions more rapidly, owing to the functions of the micro pin tools 105A and 105B.

(6) After the completion of the assembly of the functional chips 103 onto the mounting substrate 102, the transparent plate 109 is removed first from the flat plate 101 and then the fluid 115 is removed from the container 200. The mounting substrate 102 and the functional chips 103 are then dried.

(7) The flat plate 101 is removed from the mounting substrate 102, and the functional chips 103 are then fixed onto the mounting substrate 102 by performing a heat treatment while lightly pressing the upper surfaces of all of the functional chips 103, as either the recesses 104 or the electrodes 112 of the functional chips 103 have a solder-material plated beforehand on their bottom surfaces. Subsequently, the mounting substrate 102 is divided into sub mount formation regions 102b, for example.

It should be noted that the functional chips 103 are not limited to semiconductor lasers, but may also be functional devices made of a conductor, semiconductor, insulating glass, insulating resin, or dielectric material, which are used for electronic components, such as IC chips, optical devices, resistors, and capacitors, or micro electro mechanical systems (MEMSs), for example.

As described above, the semiconductor-device fabrication methods and the semiconductor-device assembly apparatuses of the present invention are applicable to semiconductor lasers, MEMSs, optical devices, liquid crystal display devices, IC chips and the like. In addition, the present invention is also equally applicable to functional chips or the like made of a conductor, semiconductor, insulator, or dielectric material in technical fields other than those mentioned above.

What is claimed is:

1. A semiconductor-device assembly method comprising the steps of:
   (a) preparing a mounting substrate having, on its principal surface, a plurality of recesses which correspond in plan configuration to a plurality of functional chips; and a flat plate disposed on the mounting substrate and having a plurality of confinement regions formed of openings, each of which exposes one of the recesses and a peripheral portion of the recess and is designed to confine one of the functional chips;
   (b) putting the functional chips into the respective confinement regions on the mounting substrate;
   (c) immersing in a fluid the mounting substrate having the functional chips thereon, together with the flat plate; and
   (d) displacing the flat plate immersed in the fluid with the mounting substrate fixed, thereby fitting the functional chips into the recesses in the mounting substrate.

2. The method of claim 1, wherein in the step (d), the displacement of the flat plate is limited within a range in which unassembled functional chips that have not yet been fitted into the recesses move to the recesses but do not come into contact with assembled functional chips that have already been fitted into the recesses.

3. The method of claim 2, wherein when the functional chips have a high degree of symmetry in their plan configuration and are not directional, the confinement regions are similar in plan configuration to the functional chips or the recesses.

4. The method of claim 2, wherein when the functional chips have a low degree of symmetry in their plan configuration, the dimensions of the confinement regions are set to values which prevent the functional chips from rotating 90 degrees or more in the confinement regions.

5. The method of claim 1, wherein in the step (d), the displacement of the flat plate is performed in a direction parallel to the surface of the substrate and perpendicular to the edges of the functional chips or the peripheries of the recesses.

6. The method of claim 5, wherein when the functional chips have a high degree of symmetry in their plan configuration and are not directional, the confinement regions are similar in plan configuration to the functional chips or the recesses.

7. The method of claim 5, wherein when the functional chips have a low degree of symmetry in their plan configuration, the dimensions of the confinement regions are set to values which prevent the functional chips from rotating 90 degrees or more in the confinement regions.

8. The method of claim 1, wherein in the step (c), the mounting substrate and the flat plate are immersed in the fluid with the flat plate covered with a lid.

9. The method of claim 1, further comprising:
   before the step (b), the step (e) of providing a solder material on the bottom surfaces of the recesses in the mounting substrate or on the bottom surfaces of the functional chips; and
   after the step (d), the step (f) of removing the fluid from the mounting substrate and then heating the mounting substrate to fix the functional chips on the mounting substrate.

10. The method of claim 9, wherein in the step (f), the mounting substrate is heated with the functional chips pressed from above.

11. A semiconductor-device assembly method comprising the steps of:
    (a) preparing a mounting substrate having, on its principal surface, a plurality of recesses which correspond in plan configuration to a plurality of functional chips; and a flat plate disposed on the mounting substrate and having a plurality of confinement regions formed of openings, each of which exposes one of the recesses and a peripheral portion of the recess and is designed to confine one of the functional chips;
    (b) putting the functional chips into the respective confinement regions on the mounting substrate;
    (c) immersing in a fluid the mounting substrate having the functional chips thereon, together with the flat plate; and
    (d) displacing the mounting substrate immersed in the fluid with the flat plate fixed, thereby fitting the functional chips into the recesses in the mounting substrate.

12. The method of claim 11, wherein in the step (d), the displacement of the mounting substrate is limited within a range in which unassembled functional chips that have not yet been fitted into the recesses move to the recesses but do not come into contact with assembled functional chips that have already been fitted into the recesses.

13. The method of claim 12, wherein when the functional chips have a high degree of symmetry in their plan configuration and are not directional, the confinement regions are similar in plan configuration to the functional chips or the recesses.

14. The method of claim 12, wherein when the functional chips have a low degree of symmetry in their plan configuration, the dimensions of the confinement regions are set to values which prevent the functional chips from rotating 90 degrees or more in the confinement regions.

15. The method of claim 11, wherein in the step (d), the displacement of the mounting substrate is performed in a direction parallel to the surface of the substrate and perpendicular to the edges of the functional chips or the peripheries of the recesses.

16. The method of claim 15, wherein when the functional chips have a high degree of symmetry in their plan configuration and are not directional, the confinement regions are similar in plan configuration to the functional chips or the recesses.

17. The method of claim 15, wherein when the functional chips have a low degree of symmetry in their plan configuration, the dimensions of the confinement regions are set to values which prevent the functional chips from rotating 90 degrees or more in the confinement regions.

18. The method of claim 11, wherein in the step (c), the mounting substrate and the flat plate are immersed in the fluid with the flat plate covered with a lid.

19. The method of claim 11, further comprising:
before the step (b), the step (e) of providing a solder material on the bottom surfaces of the recesses in the mounting substrate or on the bottom surfaces of the functional chips; and
after the step (d), the step (f) of removing the fluid from the mounting substrate and then heating the mounting substrate to fix the functional chips on the mounting substrate.

20. The method of claim 19, wherein in the step (f), the mounting substrate is heated with the functional chips pressed from above.

21. A semiconductor-device assembly method comprising the steps of:
(a) preparing a mounting substrate having a plurality of recesses and sets of small slots; small pins formed movable through the small slots in the mounting substrate; and a flat plate disposed on the mounting substrate and having a plurality of confinement regions, wherein the recesses are formed on the principal surface of the mounting substrate and correspond in plan configuration to a plurality of functional chips, each of the small slot sets is formed near one of the recesses, the small slots are smaller in plan dimensions than the recesses, and the confinement regions are formed of openings, each of which exposes one of the recesses and one of the small slot sets and is designed to confine one of the functional chips;
(b) putting the functional chips into the respective confinement regions on the mounting substrate;
(c) immersing in a fluid the mounting substrate having the functional chips thereon, together with the flat plate and the small pins; and
(d) displacing the small pins immersed in the fluid with the mounting substrate and the flat plate fixed, thereby fitting the functional chips into the recesses in the mounting substrate.

22. The method of claim 21, wherein in the step (d), the displacement of the small pins is limited within a range in which unassembled functional chips that have not yet been fitted into the recesses move to the recesses but do not come into contact with assembled functional chips that have already been fitted into the recesses.

23. The method of claim 21, wherein the small slots in the mounting substrate are formed so that in the step (d), the displacement of the small pins is performed in a direction parallel to the surface of the substrate and perpendicular to the edges of the functional chips or the peripheries of the recesses.

24. The method of claim 21, wherein in the step (c), the mounting substrate and the flat plate are immersed in the fluid with the flat plate covered with a lid.

25. The method of claim 21, further comprising:
before the step (b), the step (e) of providing a solder material on the bottom surfaces of the recesses in the mounting substrate or on the bottom surfaces of the functional chips; and
after the step (d), the step (f) of removing the fluid from the mounting substrate and then heating the mounting substrate to fix the functional chips on the mounting substrate.

26. The method of claim 25, wherein in the step (f), the mounting substrate is heated with the functional chips pressed from above.

27. A semiconductor-device assembly method for assembling onto a mounting substrate at least two types of functional chips which are different in size but similar in plan configuration, the method comprising the steps of:
(a) preparing a mounting substrate having, on its principal surface, a plurality of recesses which correspond in plan configuration to the two types of functional chips; and a flat plate disposed on the mounting substrate and having a plurality of confinement regions formed of openings, which expose the recesses and peripheral portions of the recesses and are designed to confine the two types of functional chips;
(b) providing a solder material on the bottom surfaces of the functional chips of one of the two types and on the bottom surfaces of some of the recesses in the mounting substrate which correspond to the functional chips of the other type;
(c) putting the functional chips of the other type into some of the confinement regions on the mounting substrate which include therein the recesses corresponding to the functional chips of the other type and having the solder material thereon;
(d) immersing in a fluid the mounting substrate having the functional chips of the other type thereon, together with the flat plate;
(e) displacing the mounting substrate or the flat plate immersed in the fluid, thereby fitting the functional chips of the other type into the corresponding recesses in the mounting substrate;
(f) removing the fluid from the mounting substrate and then heating the mounting substrate to fix the functional chips of the other type on the mounting substrate;
(g) putting the functional chips of the one type having the solder material on their bottom surfaces, into some of the confinement regions on the mounting substrate which include therein the recesses corresponding to the functional chips of the one type;
(h) immersing in a fluid the mounting substrate having the functional chips of the one type thereon, together with the flat plate;
(i) displacing the mounting substrate or the flat plate immersed in the fluid, thereby fitting the functional chips of the one type into the corresponding recesses in the mounting substrate; and
(j) removing the fluid from the mounting substrate and then heating the mounting substrate to fix the functional chips of the one type on the mounting substrate.

28. The method of claim 27, wherein in the steps (f) and (j), the mounting substrate is heated with the functional chips pressed from above.

* * * * *